(12) United States Patent
Duster et al.

(10) Patent No.: US 8,018,288 B2
(45) Date of Patent: Sep. 13, 2011

(54) HIGH-LINEARITY LOW NOISE AMPLIFIER

(75) Inventors: Jon S. Duster, Beaverton, OR (US);
Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 100 days.

(21) Appl. No.: 12/422,430

(22) Filed: Apr. 13, 2009

(65) Prior Publication Data
US 2010/0259331 A1    Oct. 14, 2010

(51) Int. Cl.
*H03F 3/04* (2006.01)
(52) U.S. Cl. .................. 330/311; 330/306; 330/253
(58) Field of Classification Search .................. 330/311, 330/306, 253
See application file for complete search history.

(56) References Cited

U.S. PATENT DOCUMENTS

| 6,681,103 | B1 * | 1/2004 | Rogers et al. | 455/302 |
| 7,221,924 | B2 * | 5/2007 | Zheng et al. | 455/307 |
| 7,266,360 | B2 * | 9/2007 | Kang et al. | 455/302 |
| 7,629,850 | B2 * | 12/2009 | Floyd et al. | 330/285 |
| 7,647,035 | B2 * | 1/2010 | Rofougaran | 455/313 |
| 2002/0173287 | A1 * | 11/2002 | Mitchell Rogers | 455/307 |
| 2006/0154638 | A1 | 7/2006 | Zheng et al. | |
| 2007/0182481 | A1 | 8/2007 | Wu et al. | |
| 2008/0220735 | A1 | 9/2008 | Kim et al. | |
| 2008/0246538 | A1 * | 10/2008 | Beffa | 327/557 |

FOREIGN PATENT DOCUMENTS

| WO | 2010/120594 A2 | 10/2010 |
| WO | 2010/120594 A3 | 1/2011 |

OTHER PUBLICATIONS

International Search Report and Written Opinion received for PCT Patent Application No. PCT/US2010/030027, mailed on Oct. 27, 2010, 9 pages.

* cited by examiner

*Primary Examiner* — Patricia Nguyen
(74) *Attorney, Agent, or Firm* — David L. Guglielmi

(57) ABSTRACT

Embodiments of a high-linearity low-noise amplifier (LNA) are generally described herein. Other embodiments may be described and claimed. In some embodiments, an RF input signal may be amplified with a cascode amplifier. The cascode amplifier may include integrated notch filters to attenuate undesired signals. The cascode amplifier may operate from a large power supply when blockers are present to avoid voltage swing compression at its output. The cascode amplifier may be biased and designed to operate in a class AB mode to produce linear output current to avoid current compression or excessive current expansion.

19 Claims, 2 Drawing Sheets

HIGH-LINEARITY LOW NOISE AMPLIFIER

TECHNICAL FIELD

The present invention generally relates to low-noise amplifiers (LNAs), and in particular to a high-linearity low noise amplifier.

BACKGROUND

For operation in a hostile multi-radio environment, a high-performance receiver may need to have a highly-linear and highly-sensitive front end. Highly sensitive LNAs with high-output compression points are difficult to implement in low-voltage scaled CMOS technology due to the larger output swings that are required for high-performance receivers. The use of highly-linear and highly-sensitive front ends, however, generally adds considerable cost to the high-performance receiver.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
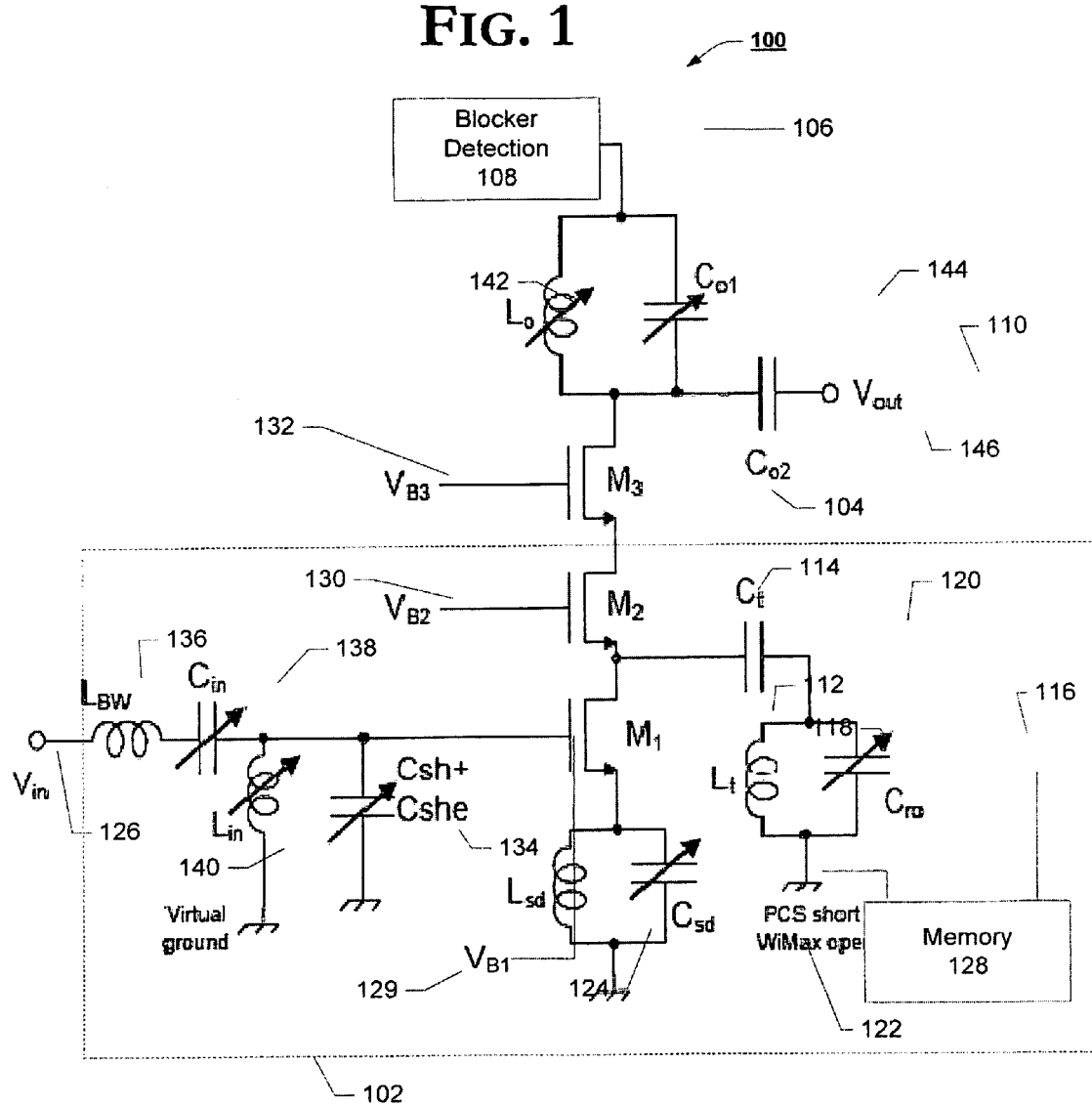
FIG. 1 is a circuit diagram of an example LNA in accordance with some embodiments of the present invention.

FIG. 1 is a circuit diagram of an example LNA in accordance with some embodiments of the present invention. LNA 100 comprises cascode amplifier 102, common-gate transistor 104 coupled to an output of cascode amplifier 102, and power supply 106 coupled to common-gate transistor 104. In some embodiment, common-gate transistor 104 may be omitted. Power supply 106 may represent a large power supply that operates at a high voltage. In one embodiment, power supply 106 operates at a high voltage of about 2.5V in the presence of undesired signals (blockers) and operates at a lower voltage of about 1.2V in the absence of blockers. Blocker detection 108 may provide LNA 100 with the ability to detect undesired signals and to adjust power supply 106 accordingly. In one embodiment, blocker detection 108 represents a peak detector or a simple spectrum analyzer connected at output 110.

In some embodiments, cascode amplifier 102 comprises common-source transistor (M1) 112 coupled with common-gate transistor (M2) 114. Cascode amplifier 102 also includes integrated filters to attenuate undesired signals. As shown, cascode amplifier 102 includes two resonant traps to attenuate blockers. The first resonant trap is at the output of common-source transistor 112 and is formed by capacitor 116 (Cro) in parallel with inductor 118 (Lt), which are in series with capacitor 120 (Ct). In some embodiments, this first resonant trap is coupled with the output of common-gate transistor 114. In some embodiments, an additional resonant trap (not shown) is coupled with the output of common-gate transistor 114. The second resonant trap is at the source of common-source transistor 112 and is formed by capacitor 122 (Csd) in parallel with inductor 124 (Lsd). In one embodiment, where input 126 (Vin) is coupled with an antenna designed to receive Wifi or WiMax bands in the 2.3-2.5 GHz ranges, the resonant traps may be designed to attenuate the 1.9-2 GHz Personal Communication Services (PCS) band. In one embodiment, memory 128 represents a programmable memory that is able to control variable components (for example capacitors 116 and 122) of the resonant traps to attenuate varying frequency bands.

In some embodiments, bias voltage 129 (Vb1) of common-source transistor 112 may be selected to place LNA 100 in a class AB mode to produce linear output current to avoid current compression or excessive current expansion. In some embodiments, bias voltage 132 (Vb3) of the second common-gate transistor 104 may be selected based on bias voltage 130 of the first common-gate transistor 114. In some embodiments, bias voltages 130 and 132 are selected to place common-gate transistors 114 and 104, respectively into a high gain mode, although the scope of the invention is not limited in this respect. In some embodiments, bias voltages 130 and 132 may be dynamically biased.

In some embodiments, common-source transistor 112, common-gate transistor 114 and common-gate transistor 104 may comprise low-breakdown voltage N-MOS transistors, although the scope of the invention is not limited in this respect as the configuration of LNA 100 may also be suitable for use with P-MOS and other types of transistors (e.g., bipolar transistors).

In some embodiments when the transistors of LNA 100 share the same well, the body contacts (not shown) of the transistors may be connected to ground. In other embodiments, when the transistors have separate wells, their body contacts may be connected to the transistor's source, although the scope of the invention is not limited in this respect.

In some embodiments, cascode amplifier 102 may also include inductors 136 (Lbw) and 140 (Lin) and capacitors 134 (Csh) and 138 (Cin), which may serve as a part of an input-matching network. LNA 100 may be coupled to power supply 106 through inductor 142 (Lo) and capacitor 144 (Co1) and the output 110 of LNA 100 may be provided through output capacitor 146 (Co2). Inductor 142 and capacitors 144 and 146 may be part of an output matching network that may be selected based on the load of LNA 100.

In some embodiments, LNA 100 may be part of a differential LNA in which two single-ended LNAs may operate together as a differential LNA. In these embodiments, LNA 100 may operate as a single-ended LNA and another LNA, which may be identical to LNA 100, may operate as the other single-ended LNA. Each single-ended LNA may receive and amplify one portion of a differential signal.

Figure 2:
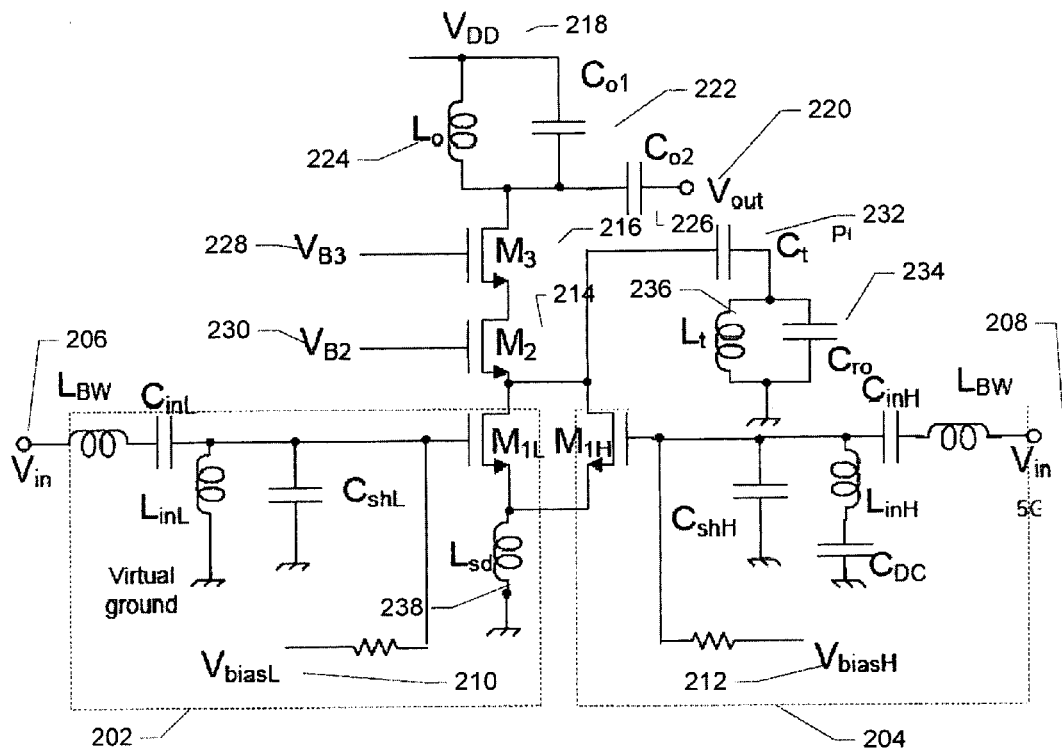
FIG. 2 is a circuit diagram of another example LNA in accordance with some embodiments of the present invention.

FIG. 2 is a circuit diagram of another example LNA in accordance with some embodiments of the present invention. LNA 200 comprises first common-source amplifier 202 and second common-source amplifier 204 to amplify inputs 206 and 208, respectively. In one embodiment, first amplifier 202 is designed to amplify a low-mid band and second amplifier 204 is designed to amplify a high band. The common-source transistors of amplifiers 202 (M1L) and 204 (M1H) are coupled with common-gate transistors 214 (M2) and 216 (M3).

In some embodiments, bias voltage 228 (Vb3) of the second common-gate transistor 216 may be selected based on bias voltage 230 of the first common-gate transistor 214. In some embodiments, bias voltages 228 and 230 are selected to place common-gate transistors 216 and 214, respectively, into a high gain mode, although the scope of the invention is not limited in this respect. In some embodiments, bias voltages 228 and 230 may be dynamically altered.

LNA 200 also includes a notch filter to attenuate undesired signals. As shown, LNA 200 includes passive components including inductor 236 (Lt) capacitor 234 (Cro) and capacitor 232 (Ct) to form a filter at the output of amplifiers 202 and 204, however it should be appreciated that components 236, 234 and 232 could be variable components as well.

Common-source amplifiers 202 and 204 are shown as including input matching networks, however the components shown are merely one example and the scope of the present invention is not limited to the configuration shown.

In some embodiments, common-source amplifiers 202 and 204 may also include bias voltages 210 and 212, respectively, which may serve to establish class AB mode biasing for large blocking signals. LNA 200 may be coupled to power supply 218 through inductor 224 (Lo) and capacitor 222 (Co1) and the output 220 of LNA 200 may be provided through output capacitor 226 (Co2). Inductor 224 and capacitors 222 and 220 may be part of an output matching network that may be selected based on the load of LNA 200.

Figure 3:
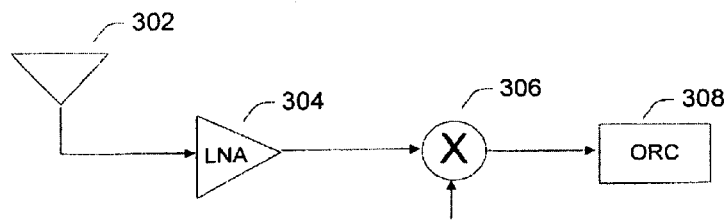
FIG. 3 is a functional block diagram of a receiver in accordance with some embodiments of the present invention.

FIG. 3 is a functional block diagram of a receiver in accordance with some embodiments of the present invention. Receiver 300 comprises antenna 302, LNA 304, downconversion circuitry 306, and other receiver circuitry (ORC) 308. Downconversion circuitry 306 may be optional. Other receiver circuitry 308 may include, for example, a variable gain amplifier, other filter and amplification circuitry as well as baseband processing circuitry. In some embodiments, receiver 300 may be an OFDM receiver suitable for use in a WLAN and/or WiMax system, described in more detail below. In some multiple-input multiple-output (MIMO) embodiments, receiver 300 may have additional receive signal paths each comprising at least antenna 302, LNA 304 and/or downconverter 306, although the scope of the invention is not limited in this respect.

In some embodiments, LNA 304 may amplify RF input signals received through antenna 302 with a cascode amplifier and a common-gate stage. LNA 304 may include one or more integrated notch filter(s) to attenuate undesired signals, may operate from a large power supply, and may be biased and designed to operate in a class AB mode to produce linear output current. In some embodiments, LNA 100 (FIG. 1) or LNA 200 (FIG. 2) may be suitable for use as LNA 304, although other LNA configurations may also be suitable. Accordingly, embodiments of the present invention allow for the implementation of a high output compression LNA in scaled CMOS technology having a large voltage swing. These embodiments of an LNA may be suitable for use in a high-linearity, high sensitivity receiver, such as receiver 300, suitable for operating in a hostile multi-radio environment in the presence of large blockers. One skilled in the art would appreciate that LNA 304 may enable receiver 300 to eliminate a front end module (FEM) with pre-select filters, which are typically included in receivers of this type. The elimination of the pre-select filter may also improve receiver sensitivity by eliminating or reducing the insertion loss of the pre-select filter, which may typically range between 1.5 and 3 dB.

In some embodiments, LNA 304 may comprise multiply amplifiers such as LNA 200 (FIG. 2). In these embodiments, each amplifier of LNA 304 may amplify separate RF signals provided by multiple antenna 302.

In one embodiment, downconverter 306 represents a passive mixer terminated into a low impedance resulting in LNA 304 achieving a very high single tone out of channel compression point of around 0 dBm, which is typically 10-20 dB greater than prior art implementations. This compression point may be achieved with an out of channel signal as close as about 100 MHz away from the desired signal, which previously has not been possible without front end filtering.

Although receiver 300 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of receiver 300 may refer to one or more processes operating on one or more processing elements.

In some embodiments, receiver 300 may be part of a portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

In some embodiments, receiver 300 may be part of a wireless communication device that communicates in accordance with one or more communication techniques and/or standards, such as the Global System for Mobile Communications (GSM) standard. In some embodiments, receiver 300 may receive signals in accordance with a spread-spectrum technique, such as code division multiple access (CDMA). In some embodiments, receiver 300 may be a multicarrier transmitter that may receive orthogonal frequency division multiplexed (OFDM) communication signals over a multicarrier communication channel. The OFDM signals may comprise a plurality of orthogonal subcarriers. In some of these multicarrier embodiments, receiver 300 may be part of a wireless local area networks (WLANs) communication station such as a wireless access point (AP), base station or a mobile device including a Wireless Fidelity (WiFi) device. In some multicarrier embodiments, receiver 300 may be part of a broadband wireless access (BWA) network communication station, such as a Worldwide Interoperability for Microwave Access (WiMax) communication station, although the scope of the invention is not limited in this respect.

In some embodiments, receiver 300 may communicate in accordance with specific communication standards, such as the Institute of Electrical and Electronics Engineers (IEEE) standards including IEEE 802.11(a), 802.11(b), 802.11(g), 802.11(h) and/or 802.11(n) standards and/or proposed specifications for WLANs, although the scope of the invention is not limited in this respect as they may also be suitable to transmit and/or receive communications in accordance with other techniques and standards. In some embodiments, receiver 300 may communicate in accordance with the IEEE 802.16-2004 and the IEEE 802.16(e) standards for wireless metropolitan area networks (WMANs) including variations and evolutions thereof, although the scope of the invention is not limited in this respect as they may also be suitable to transmit and/or receive communications in accordance with other techniques and standards. For more information with respect to the IEEE 802.11 and IEEE 802.16 standards, please refer to "IEEE Standards for Information Technology—Telecommunications and Information Exchange between Systems"—Local Area Networks—Specific Requirements—Part 11 "Wireless LAN Medium Access Control (MAC) and Physical Layer (PHY), ISO/IEC 8802-11: 1999", and Metropolitan Area Networks—Specific Requirements—Part 16: "Air Interface for Fixed Broadband Wireless Access Systems," May 2005 and related amendments/versions.

Antenna 302 may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input, multiple-output (MIMO) embodiments, the antennas may be effectively separated to take advantage of spatial diversity and the different channel characteristics that may result between each of the antennas a transmitting communication station.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus, the following claims are hereby incorporated into the detailed description, with each claim standing on its own as a separate preferred embodiment.

What is claimed is:

1. A low-noise amplifier (LNA) comprising:
a cascode amplifier;
an integrated notch filter to attenuate undesired signals; and
a power supply that operates at a high voltage when undesired signals are present, wherein the cascode amplifier comprises a common-source transistor coupled with a first common-gate transistor,
further comprising a second common-gate transistor coupled to an output of the cascode amplifier,
wherein the integrated notch filter comprises a first resonant trap at the output of the common-source transistor, and
further comprising a second resonant trap in a source of the common-source transistor.

2. The LNA of claim 1 wherein the common-source transistor, the first common-gate transistor, and the second common-gate transistor comprise N-MOS transistors.

3. The LNA of claim 1 wherein the first and second resonant traps comprise variable components controlled by a programmable memory.

4. The LNA of claim 1 wherein the common-source transistor is biased to operate the LNA in a class AB mode.

5. The LNA of claim 1 further comprising a second common-source transistor, the first common-source transistor to amplify a first band and the second common-source transistor to amplify a second band.

6. The LNA of claim 1 wherein the power supply operates at a lower voltage when undesired signals are not present, and further comprising circuitry to detect undesired signals and adjust the power supply.

7. The LNA of claim 6 wherein the high voltage comprises about 2.5 Volts and the lower voltage comprises about 1.2 Volts.

8. A low-noise amplifier (LNA) comprising:
a CMOS cascode amplifier, wherein the CMOS cascode amplifier comprises a common-source transistor coupled with a common-gate transistor, wherein the common-source transistor is biased and designed to operate in a class AB mode to produce a linear output current;
an integrated notch filter to attenuate undesired signals;
a power supply that operates at a high voltage when undesired signals are present, the power supply to operate at a lower voltage when undesired signals are not present; and
circuitry to detect undesired signals and adjust the power supply voltage.

9. The LNA of claim 8 further comprising a second CMOS cascode amplifier, the first CMOS cascode amplifier to amplify a low-midband and the second CMOS cascode amplifier to amplify a high band.

10. The LNA of claim 8 wherein the CMOS cascode amplifier comprises N-MOS transistors.

11. The LNA of claim 8 wherein the integrated notch filter comprises a resonant trap.

12. The LNA of claim 8 wherein the integrated notch filter is coupled with an output of a common-source transistor.

13. A receiver comprising a low-noise amplifier (LNA) to amplify an RF signal received through an antenna, wherein the LNA comprises a CMOS cascode amplifier, the CMOS cascode amplifier integrating a notch filter to attenuate undesired signals, the CMOS cascode amplifier operating from a large power supply, the CMOS cascode amplifier biased and designed to operate in a class AB mode to produce linear output current, and wherein the LNA is coupled with the antenna without a pre-select filter between the LNA and the antenna.

14. The receiver of claim 13 wherein the CMOS cascode amplifier comprises a common-source transistor coupled with a first common-gate transistor, and
further comprising a second common-gate transistor coupled to an output of the CMOS cascode amplifier.

15. The receiver of claim 13 further comprising a second LNA to amplify a second RF signal received through a second antenna.

16. The receiver of claim 13 wherein the integrated notch filter comprises a resonant trap including variable components controlled by a programmable memory.

17. The receiver of claim 13 wherein the integrated notch filter is coupled with an output of the CMOS cascode amplifier.

18. The receiver of claim 13 wherein the large power supply operates at about 2.5 Volts when undesired signals are present, the large power supply operates at about 1.2 Volts when undesired signals are not present, and further comprising circuitry to detect undesired signals and adjust the large power supply.

19. The receiver of claim 13 further comprising a passive mixer terminated into a low impedance, wherein the LNA achieves a single tone out of channel compression point or about 0 dBm.

* * * * *